United States Patent
Kauter et al.

(10) Patent No.: US 10,018,685 B2
(45) Date of Patent: Jul. 10, 2018

(54) METHOD FOR OPERATING A MAGNETIC FIELD DETECTOR CIRCUIT AND A MAGNETIC FIELD DETECTOR CIRCUIT

(71) Applicant: Micronas GmbH, Freiburg (DE)

(72) Inventors: Thomas Kauter, Freiburg (DE); David Muthers, Denzlingen (DE); Joachim Ritter, Loerrach (DE)

(73) Assignee: TDK-Micronas GmbH, Freiburg (DE)

( * ) Notice: Subject to any disclaimer, the term of this patent is extended or adjusted under 35 U.S.C. 154(b) by 0 days.

(21) Appl. No.: 15/366,401

(22) Filed: Dec. 1, 2016

(65) Prior Publication Data
US 2017/0153297 A1    Jun. 1, 2017

(30) Foreign Application Priority Data
Dec. 1, 2015   (DE) .................. 10 2015 015 350

(51) Int. Cl.
| G01R 33/06 | (2006.01) |
| G01R 33/00 | (2006.01) |
| G01R 33/07 | (2006.01) |

(52) U.S. Cl.
CPC ......... G01R 33/0023 (2013.01); G01R 33/07 (2013.01)

(58) Field of Classification Search
CPC ........ G01R 33/02; G01R 33/06; G01R 33/07; G01R 33/09; G01R 33/0023; G01R 33/072; G01R 33/0047
USPC .... 324/200–263, 345–371, 529, 179, 764.01
See application file for complete search history.

(56) References Cited

U.S. PATENT DOCUMENTS

| 5,619,137 | A | 4/1997 | Vig et al. |
| 5,790,046 | A * | 8/1998 | Blossfeld ............... G01D 1/18 307/116 |
| 2008/0315865 | A1 | 12/2008 | Doogue et al. |
| 2010/0079138 | A1 | 4/2010 | David et al. |
| 2011/0074404 | A1 * | 3/2011 | Hikichi ............... G01R 33/072 324/251 |
| 2012/0062222 | A1 | 3/2012 | Watanabe et al. |
| 2012/0182658 | A1 * | 7/2012 | Motz ................... G01P 3/489 361/91.5 |
| 2014/0011450 | A1 * | 1/2014 | Audic ................... H04B 5/00 455/41.1 |
| 2015/0333752 | A1 * | 11/2015 | Motz ................... G01P 3/489 327/72 |
| 2016/0146903 | A1 * | 5/2016 | Yang ................. G01R 33/0035 324/244 |

FOREIGN PATENT DOCUMENTS

DE        197 04 782 A1    10/1997

* cited by examiner

*Primary Examiner* — Thang Le
(74) *Attorney, Agent, or Firm* — Muncy, Geissler, Olds & Lowe, P.C.

(57) ABSTRACT

A method is provided for operating a magnetic field detector circuit, whereby the magnetic field detector circuit is operated alternately in an active state or in a sleep state and the magnetic field detector circuit has a magnetic field measuring device and a wake-up timer, whereby the magnetic field measuring device comprises a magnetic field sensor. In the active state, the magnetic field measuring device is operated with a supply voltage and an output signal is generated by the magnetic field sensor. The magnetic field detector circuit comprises a wake-up timer, whereby the wake-up timer is operated with the supply voltage in the sleep state and a wake-up signal is generated by the wake-up timer after a predetermined sleep interval, and the magnetic field measuring device changes from the sleep state to the active state.

15 Claims, 2 Drawing Sheets

METHOD FOR OPERATING A MAGNETIC FIELD DETECTOR CIRCUIT AND A MAGNETIC FIELD DETECTOR CIRCUIT

This nonprovisional application claims priority under 35 U.S.C. § 119(a) to German Patent Application No. 10 2015 015 350.1, which was filed in Germany on Dec. 1, 2015, and which is herein incorporated by reference.

BACKGROUND OF THE INVENTION

Field of the Invention

The invention relates to a method for operating a magnetic field detector circuit and a magnetic field detector circuit.

Description of the Background Art

A magnetic field detector, whose power supply is turned on and off cyclically to reduce power consumption, is known from DE 197 04 782 A1, which corresponds to U.S. Pat. No. 5,619,137. The excitation current is chopped by a free-running clock unit. A binary output signal is stored by an edge-triggered flip-flop.

U.S. Ser. No. 2012/0062222 A1 discloses operating a magnetic field detector in an economy mode or an operating mode depending on the presence of a magnetic field, whereby the magnetic field detector is supplied with a chopped excitation current in both modes.

SUMMARY OF THE INVENTION

It is therefore an object of the invention to provide a method and device for carrying out the method, which refine the prior art.

According to an exemplary embodiment of the invention, a method for operating a magnetic field detector circuit is provided, whereby the magnetic field detector circuit is operated alternately in an active state or in a sleep state and the magnetic field detector circuit has a magnetic field measuring device and a wake-up timer, whereby the magnetic field measuring device comprises a magnetic field sensor.

In the active state, the magnetic field measuring device is operated with a supply voltage and an output signal is generated by the magnetic field sensor. The magnetic field detector circuit comprises a wake-up timer, whereby the wake-up timer is operated with the supply voltage in the sleep state and a wake-up signal is generated by the wake-up timer after a predetermined sleep interval, and the magnetic field measuring device changes from the sleep state to the active state.

The magnetic field detector circuit comprises a first predetermined threshold and a second predetermined threshold. In a first alternative, the magnetic field measuring device changes to the sleep state, when the output signal of the magnetic field sensor is below the second threshold, or according to an alternative, the magnetic field measuring device changes to the sleep state, when the output signal of the magnetic field sensor is above the first threshold.

According to an embodiment of the invention, a magnetic field detector circuit is provided for carrying out the method according to one or more of the preceding claims, having a magnetic field measuring device, whereby the magnetic field measuring device has an input for a supply voltage and the magnetic field measuring device is connected to a control input of an output transistor unit and the magnetic field measuring device is configured to output a control signal.

Further, a state control unit is provided with an input for the supply voltage and an input for the control signal and a wake-up timer, whereby the wake-up timer has an output, connected to the state control unit, for a wake-up signal, and the wake-up timer is connected to the supply voltage and the output of the state control unit is connected to the magnetic field measuring device.

The state control unit has an output for a state signal formed depending on the control signal or depending on the wake-up signal. The state signal has a first value and a second value, whereby the magnetic field measuring device and the wake-up timer are controlled by the two values.

In an embodiment, when the first value is applied, the magnetic field measuring device can enter a sleep state, in order to apply a wake-up signal to the state control unit by the wake-up timer after a predetermined sleep interval, whereby the state signal assumes the second value upon application of the wake-up signal and changes the magnetic field measuring device to an active state upon application of the second value.

According to an embodiment of the invention, a further magnetic field detector circuit for carrying out the method is provided, having a magnetic field measuring device with an input for a supply voltage and an output for a control signal, whereby the output is connected to a control input of an output transistor unit, and the magnetic field detector circuit comprises a state control unit and the state control unit has an input for the supply voltage and an input for the control signal and an output for a state signal formed depending on the control signal.

Further, a state switch and a wake-up timer are provided, whereby the wake-up timer has an output for a wake-up signal and an input for the supply voltage, whereby the state switch is placed between the supply voltage input and the magnetic field measuring device and the wake-up timer and the state switch has an input for the state signal.

Depending on the state signal of the state switch, the magnetic field measuring device or the wake-up timer is supplied with the supply voltage or an operating current.

A state change can be brought about in the magnetic field detector circuit with the state control unit or with the state switch; i.e., the magnetic field detector circuit is switched between an active state and a sleep state. Hereinafter, the active state is also called the wake state. It should also be noted that the duration of the sleep state can also be called dead time; i.e., an applied magnetic field cannot be detected during this time.

The magnetic field detector circuit can contain one or more magnetic sensors. Examples of magnetic sensors are XMR, GMR, and in particular Hall sensors. The magnetic sensor is part of the magnetic field measuring device. Further, the magnetic field detector circuit also has components or circuit parts for supplying the sensor and for evaluating the sensor signal. In particular, the magnetic field detector circuit also can have components such as, for example, processors, at least one output transistor, e.g., a current monitoring circuit for a so-called open-drain output, and other components for monitoring and protecting parts of the magnetic field detector circuit.

During a transition to the sleep state of the magnetic field measuring device, it is switched either to a state of reduced current uptake, a so-called "power down," or in an embodiment with the state switch the supply voltage is completely switched off, so that no operating current is necessary.

The magnetic field measuring device can be shifted from a sleep mode or sleep state to a wake mode or active mode by the state control unit with application of a wake-up signal or by the state switch with application of the supply voltage. During the sleep mode duration, only the wake-up timer and the state control unit require the "normal" operating current or in the further embodiment the supply voltage is present only at the wake-up timer and the state control unit, as a result of which the current consumption of the magnetic field detector circuit is very low in both circuit variants.

The wake-up timer generates a wake-up signal after a presettable time, the sleep state interval. For this purpose, the wake-up timer can have, for example, an internal oscillator or clock and a counter.

Based on the wake-up signal, the magnetic field measuring device can be activated by the state control unit and the operating current of the magnetic field measuring device increases to the normal level or the state control unit actuates the state switch and the voltage supply is disconnected from the wake-up timer and connected to the magnetic field measuring device, as a result of which the magnetic field detector circuit changes to the active mode. The magnetic field measuring device generates a measurement signal, which is applied as the output signal to the signal output of the magnetic field detector circuit. The measurement signal further is passed on to the state control unit. If the measurement signal indicates the absence of an external magnetic field, stated differently, the measurement signal is below a presettable threshold, i.e., the magnetic field strength of an applied magnetic field is too low, thus the state control unit places the magnetic field detector circuit to the sleep mode by means of the state switch. If the measurement signal indicates the presence of a magnetic field or a magnetic field above a presettable threshold, thus the state control unit leaves the magnetic field detector circuit in the active state.

In an embodiment, the magnetic field detector circuit can be operated inverted; i.e., the magnetic field detector circuit is changed to the sleep state only when a sufficiently strong magnetic field is measured; otherwise, i.e., at a too low magnetic field strength, the magnetic field detector circuit remains in the wake state.

The measurement signal of the magnetic field detector circuit can be formed, for example, as a binary measurement signal with a first state designated as high and a second state designated as low. To this end, for example, a Hall voltage of a Hall element is compared by a comparator with a first voltage threshold.

It should be noted, furthermore, that in the presence of the active state of the magnetic field detector circuit, typically other consumers are activated or active.

A particular advantage of the device of the invention is that the average current consumption can be reduced while a high dielectric strength up to 24 V and a load-dump capability up to 40 V are retained. Tests have shown that an average current consumption of less than 100 μA is achieved by the cyclically changing wake and sleep phases. It should be noted that depending on the application the intervals for the sleep phases can be increased. Because the current uptake is correlated with the duration of the wake phases, the current uptake can be reduced further with longer sleep phases.

In an embodiment, the magnetic field measuring device remains in the active state and a control signal is output, as long as the output signal of the magnetic field sensor in the first alternative is above the second threshold or in the second alternative below the first threshold.

In the active mode, the magnetic field measuring device generates a measurement signal, which is applied as the output signal to the signal output of the magnetic field detector circuit. The measurement signal further is passed on to the state control unit. If the measurement signal indicates the absence of an external magnetic field, stated differently, if the measurement signal is below a predefinable limiting value, i.e., the magnetic field strength of an applied magnetic field is too low, thus the state control unit places the magnetic field detector circuit in the sleep mode. If the measurement signal indicates a magnetic field above a presettable threshold, thus the state control unit leaves the magnetic field detector circuit in the active state.

According to an embodiment, the magnetic field detector circuit is operated inverted; i.e., it is changed to the sleep state only when a sufficiently strong magnetic field is measured; otherwise, i.e., at a too low magnetic field strength, the magnetic field detector circuit remains in the wake state.

The measurement signal of the magnetic field detector circuit can be formed, for example, as a binary measurement signal with a first state designated as high and a second state designated as low. To this end, for example, a Hall voltage of a Hall element is compared by a comparator with a first voltage threshold.

It should be noted, furthermore, that in the presence of the active state of the magnetic field detector circuit, typically other consumers are activated or active.

In an embodiment, the predetermined sleep interval can be 5 ms to 500 ms. Particularly preferably, the duration of the sleep interval is between 50 ms and 100 ms. Because the duration of the sleep interval indicates the maximum delay time of a reaction of the magnetic field detector circuit to an external magnetic field, the duration depends substantially on the use of the magnetic field detector circuit.

It is advantageous, if the duration of the wake-up signal is made shorter than a third or preferably shorter than a tenth of the duration of the sleep interval. As already stated, the average current consumption of the magnetic field detector circuit can be reduced by a longer sleep interval.

In an embodiment, the control signal during the active state is applied to a control input of an output transistor unit and the output is monitored in terms of current during the active state. Preferably, the control signal is applied exclusively during the active state to a control input and the output is monitored in terms of current exclusively during the active state.

In an embodiment, it is provided that the first threshold is greater than the second threshold.

In an embodiment, the wake-up timer has a clock and a counter, whereby in a further embodiment the wake-up timer generates a wake-up signal after a presettable time, the so-called sleep state interval.

The magnetic field measuring device in an embodiment can have at least one Hall element or a Hall plate as a sensor for detecting a magnetic field.

In an embodiment, the magnetic field measuring device activates a control input of an output transistor unit by the control signal. It is also advantageous, if a short-circuit current monitoring unit is provided as part of a control unit to monitor the current of the output transistor during the active state.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
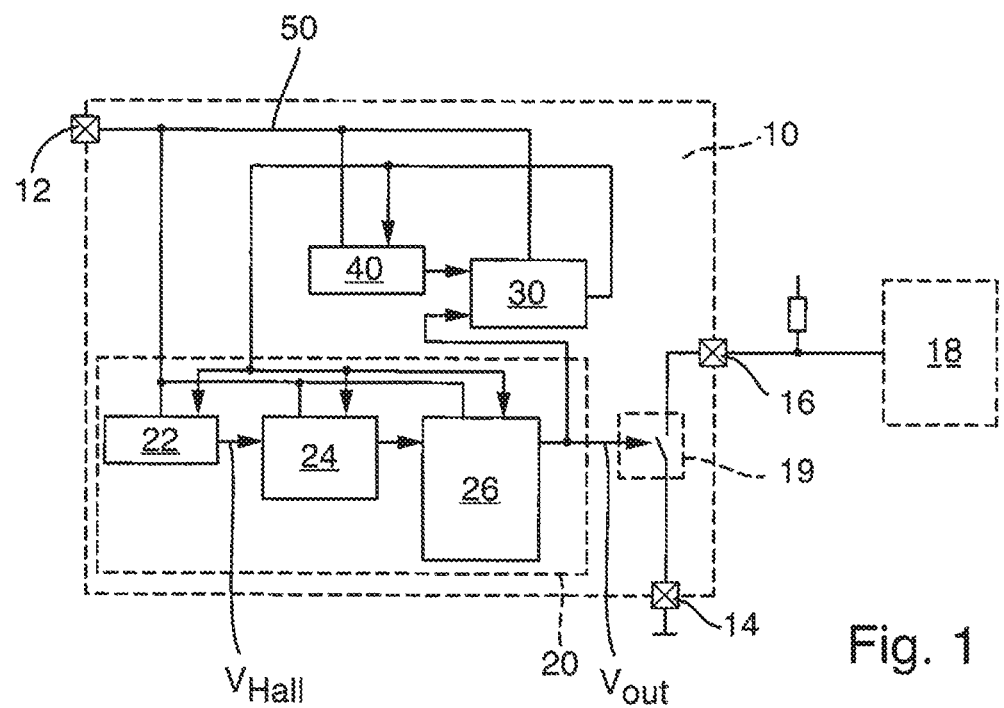
FIG. 1 shows a schematic view of an embodiment of a magnetic field detector circuit according to the invention.

The illustration in FIG. 1 shows a view of a first embodiment of a magnetic field detector circuit 10. Magnetic field detector circuit 10 has an input 12 for a supply voltage, a ground connection 14, and an output 16 for an output signal derived from a control signal Vout, whereby the output signal is passed on to further components 18.

An output transistor unit 19 is provided between ground connection 14 and output 16. Output 16 is configured as an open collector or as an open drain by means of the output transistor unit 19. Magnetic field detector circuit 10 has a magnetic field measuring device 20, a state control unit 30, and a wake-up timer 40.

Magnetic field measuring device 20 has an input for a supply voltage and is connected to the control input of output transistor unit 19, whereby the control signal Vout is to be output by magnetic field measuring device 20 in the active state.

State control unit 30 has a supply voltage terminal and an input for the control signal Vout and an input connected to an output of wake-up timer 40. State control unit 30 has an output connected to magnetic field measuring device 20 and to wake-up timer 40. Wake-up timer 40 applies a wake-up signal to state control unit 30 by means of the output.

A state signal formed depending on control signal Vout or depending on the wake-up signal is applied to the output of state control unit 30. The state signal has a first value and a second value, whereby the magnetic field measuring device 20 and wake-up timer 40 are controlled by the two values.

When the first value is applied, magnetic field measuring device 20 is placed in a sleep state. A wake-up signal is applied to state control unit 30 by means of wake-up timer 40 according to a predetermined sleep interval, whereby the state signal upon application of the wake-up signal assumes the second value and magnetic field measuring device 20 is shifted to the active state upon application of the second value.

Magnetic field measuring device 20 in the illustrated exemplary embodiment shows a magnetic field sensor 22, e.g., a Hall plate, a comparator 24 for converting an output signal VHall of magnetic field sensor 22 into a binary control signal Vout, and a control unit 26. Control unit 26 comprises a circuit for current monitoring (not shown), in particular as short-circuit protection of an open-drain output of magnetic field measuring device 20.

Figure 2:
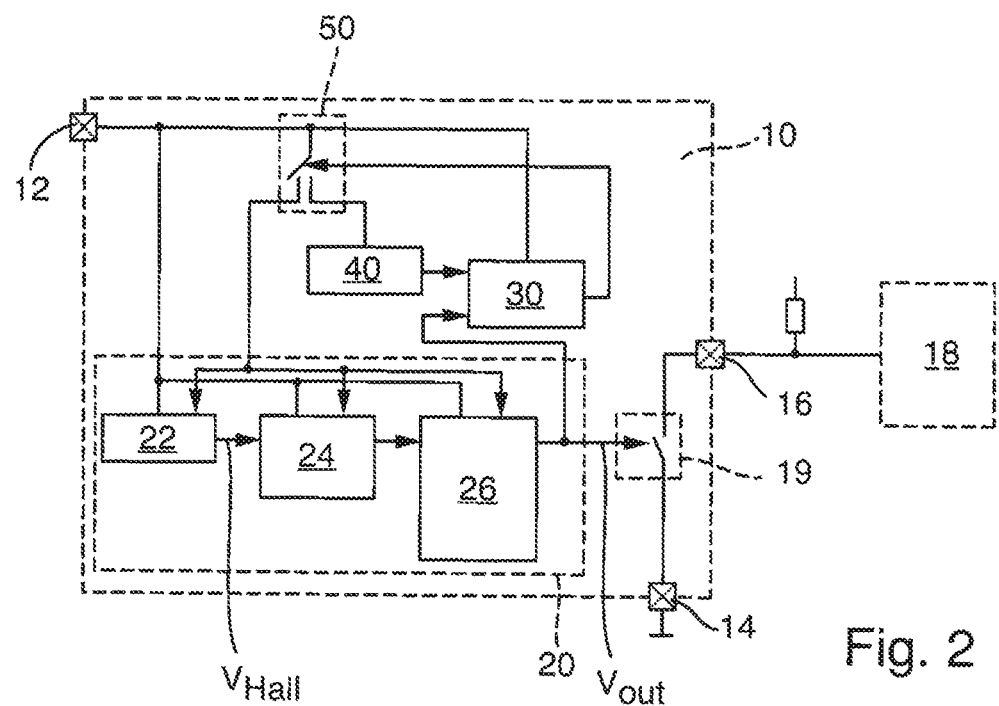
FIG. 2 shows a schematic view of an embodiment of a magnetic field detector circuit according to the invention.

The illustration in FIG. 2 shows a view of an second embodiment of a magnetic field detector circuit 10. Only the differences from the first embodiment are indicated below. Magnetic field detector circuit 10 has a state switch 50. A state change can be brought about with state switch 50 in magnetic field detector circuit 10, i.e., switched between a wake state and a sleep state. For this purpose, state switch 50 is placed between the supply voltage and magnetic field measuring device 20 and wake-up timer 40 and has an input for the state signal.

Depending on the state signal of state switch 50, either magnetic field measuring device 20 or wake-up timer 40 is supplied with the supply voltage or an operating current. Because no supply voltage is present at magnetic field measuring device 20 during the sleep interval, no magnetic field can also be measured by the magnetic field sensor.

Figure 3:
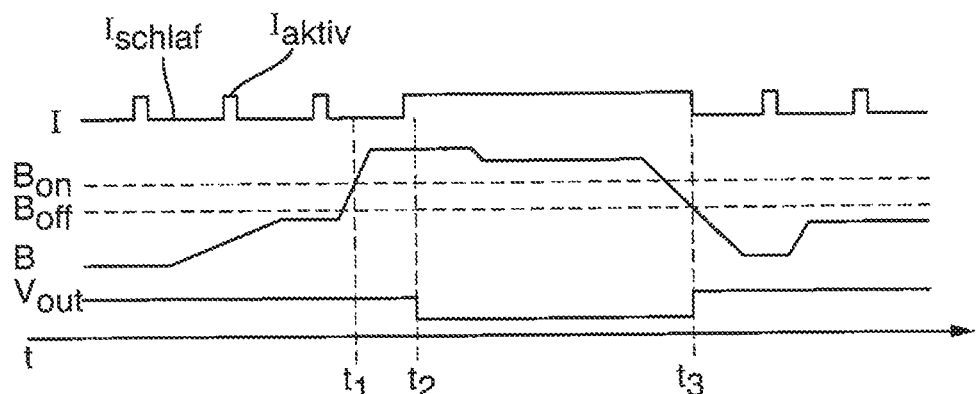
FIG. 3 shows a schematic view of a state change of a magnetic field detector circuit of the invention according to an embodiment over time.

In the illustration of FIG. 3, the state change of magnetic field detector circuit 10 over time t and as a function of the strength of an external magnetic field B is presented in a diagram. The top line of the diagram represents the current I consumed by magnetic field detector circuit 10. The middle line shows the course of the strength of external magnetic field B at the location of magnetic field sensor 22 over time t. The binary control signal Vout, which is output by magnetic field detector circuit 10, is shown in the bottom line.

As long as the strength of external magnetic field B is below a magnetic field threshold Bon, magnetic field detector circuit 10 is shifted at regular time intervals from the sleep state to the active state, as a result which the current consumption I rises from a low first value Isleep to a higher second value Iactive. The measurement signal Vout generated in the wake mode by magnetic field measuring device 20 remains high, as long as external magnetic field B is below a magnetic field threshold Bon. As a result, the output signal VHall of magnetic field sensor 22 is below a first predetermined voltage threshold, corresponding to the Hall voltage of magnetic field sensor 22 for the magnetic field threshold Bon, and magnetic field detector circuit 10 again changes to the sleep state and the current consumption I declines again to the low value Isleep.

As soon as external magnetic field B exceeds the first threshold Bon during the active phase, i.e., magnetic field sensor 22 of magnetic field measuring device 20 detects a sufficient strength of external magnetic field B during an active state, magnetic field measuring device 20 generates a control signal Vout=low. Magnetic field detector circuit 10 now remains in the active state and the current consumption I remains accordingly at a higher value Iactive.

Magnetic field detector circuit 10 does not switch at time t1 at which the external magnetic field B exceeds magnetic field threshold Bon, but only at a time t2. The maximum duration of the delay corresponds in this case to the maximum duration of a sleep interval. It is understood that a sleep interval indicates the duration between the change to the sleep state and the change based on the wake-up signal to the active state.

Magnetic field detector circuit 10 returns to the sleep state only when the external magnetic field B falls below a magnetic field threshold Boff and the magnetic field measuring device accordingly generates a control signal Vout=high, which is transmitted to state control unit 30. This state change occurs without a delay at time t3 at which magnetic field B falls below the magnetic field threshold Boff, because the strength of the magnetic field is detected without delay by magnetic field detector circuit 10 in the active state or by magnetic field sensor 22 operated in the active state almost continuously with the supply voltage.

Figure 4:
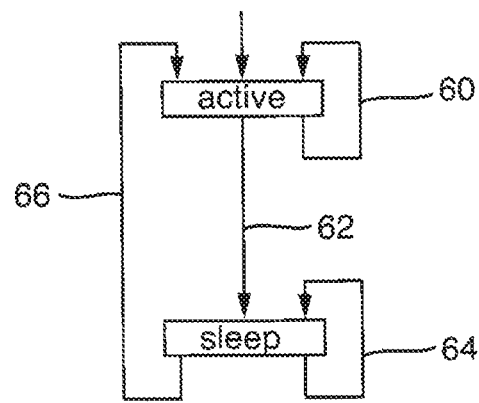
FIG. 4 shows a schematic view of the state change specifications of a magnetic field detector circuit of the invention according to an embodiment.

The state change specifications according to the first embodiment of a magnetic field detector circuit 10 of the invention are presented in FIG. 4. If magnetic field detector circuit 10 is in the active state, thus magnetic field detector circuit 10 remains in the active state, as long as the control signal Vout, transmitted to state control unit 30, of magnetic field measuring device 20 is Vout=high (indicated by the arrow labeled with 60) and changes to the sleep state as soon as control signal is Vout=low (indicated by the arrow labeled with 62). The change to the sleep state comprises the turning off of entire magnetic field measuring device 20 and the turning on of wake-up timer 40 by state switch 50.

If magnetic field detector circuit 10 is in the sleep state, then magnetic field detector circuit 10 remains in the sleep state, as long as no wake-up signal reaches state control unit 30 (indicated by the arrow labeled with 64). As soon as a wake-up signal is received, semiconductor measuring device 10 changes to the active state by turning off wake-up timer 40 and turning on the entire magnetic field measuring device 20 (indicated by the arrow labeled with 66).

Figure 5:
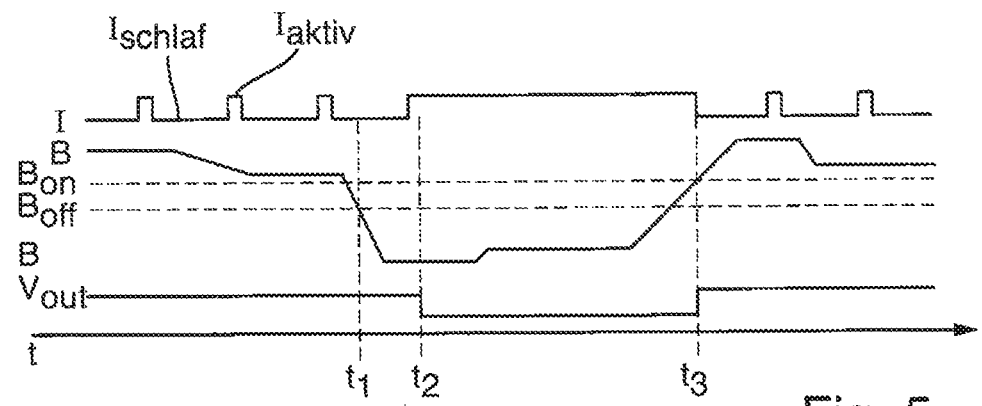
FIG. 5 shows a schematic view of the state change according to an embodiment of a magnetic field detector circuit.

The state change of a magnetic field detector circuit 10 over time t and depending on an external magnetic field B according to a second embodiment is shown in a diagram in the illustration in FIG. 5. Only the differences from the illustration in FIG. 2 will be explained below. According to the second embodiment, magnetic field detector circuit 10 changes cyclically between the sleep state and the active state, as long as external magnetic field B is above magnetic field threshold Boff.

Remaining in the active state occurs as soon as magnetic field sensor 22 of magnetic field measuring device 10 detects a decrease in external magnetic field B below the threshold Boff and the control signal is set to Vout=low. As soon as the strength of external magnetic field B exceeds magnetic field threshold Bon, this is detected by magnetic field sensor 22, operated permanently in the active state, and the control signal Vout is set to high and magnetic field detector circuit 10 changes to the sleep state, from which magnetic field detector circuit 10 is then again awakened cyclically based on the wake-up signal.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for operating a magnetic field detector circuit, the method comprising:
    operating alternately the magnetic field detector circuit in an active state or in a sleep state, the magnetic field detector circuit having a magnetic field measuring device and a wake-up timer, the magnetic field measuring device having a magnetic field sensor;
    operating, in the active state, the magnetic field measuring device with a supply voltage, an output signal being generated by the magnetic field sensor;
    providing the magnetic field detector circuit with the wake-up timer that is operated with the supply voltage in the sleep state and a wake-up signal is generated by the wake-up timer after a predetermined sleep interval, the magnetic field measuring device changing from the sleep state to the active state based on the wake-up signal; and
    providing the magnetic field detector circuit with a first predetermined threshold and a second predetermined threshold, the first predetermined threshold and the second predetermined threshold being voltage thresholds,
    wherein the magnetic field measuring device changes to the sleep state when the output signal of the magnetic field sensor is below the second predetermined threshold, or
    wherein the magnetic field measuring device changes to the active state when the output signal of the magnetic field sensor is above the first predetermined threshold.

2. The method according to claim 1, wherein the magnetic field measuring device remains in the active state and a control signal is output, as long as the output signal of the magnetic field sensor in the first alternative is above the second predetermined threshold or in the second alternative below the first predetermined threshold.

3. The method according to claim 1, wherein the predetermined sleep interval is 5 ms to 500 ms.

4. The method according to claim 1, wherein the predetermined sleep interval is 50 ms to 100 ms.

5. The method according to claim 1, wherein a duration of the wake-up signal is made shorter than a third or is made shorter than a tenth of a duration of the predetermined sleep interval.

6. The method according to claim 1, wherein a control signal during the active state is applied to a control input of an output transistor unit, and wherein a resulting output of the output transistor unit is monitored based on a current during the active state.

7. The method according to claim 1, wherein the first predetermined threshold is made greater than the second predetermined threshold.

8. The method according to claim 1, wherein the magnetic field measuring device changes from the sleep state to the active state based on the wake-up signal, and remains in the active state based on the output of the magnetic field sensor.

9. A magnetic field detector circuit, the circuit comprising:
    a magnetic field measuring device having an input for a supply voltage and being connected to a control input of an output transistor unit, the magnetic field measuring device being configured to output a control signal, the magnetic field measuring device having a magnetic field sensor;
    a state control unit with an input for the supply voltage and an input for the control signal;
    a wake-up timer having an output connected to the state control unit for a wake-up signal, the wake-up timer being connected to the supply voltage,
    wherein the output of the state control unit is connected to the magnetic field measuring device,
    wherein the state control unit has an output for a state signal formed depending on the control signal or depending on the wake-up signal,
    wherein the state signal has a first value and a second value, and
    wherein the magnetic field measuring device and the wake-up timer are controlled by the first and second values of the state signal,
    wherein the magnetic field detector circuit operates the magnetic field measuring device in an active state or in a sleep state, the supply voltage being applied to the magnetic field measuring device only in the active state,
    wherein the wake-up signal is generated by the wake-up timer after a predetermined sleep interval, the magnetic field measuring device changing from the sleep state to the active state based on the wake-up signal, wherein the state control unit changes the magnetic field measuring device to the sleep state if an output signal of the magnetic field sensor is below a predetermined voltage threshold.

10. The magnetic field detector circuit according to claim 9, wherein, when the first value is applied, the magnetic field measuring device enters the sleep state in order to apply the wake-up signal to the state control unit by the wake-up timer after a predetermined sleep interval, wherein the state signal assumes the second value upon application of the wake-up signal and changes the magnetic field measuring device to the active state upon application of the second value.

11. The magnetic field detector circuit according to claim 10, wherein a short-circuit current monitoring unit is provided as part of the control unit to monitor a current of the output transistor during the active state.

12. The magnetic field detector circuit according to claim 9, wherein the wake-up timer has a clock and a counter.

13. The magnetic field detector circuit according to claim 9, wherein the magnetic field sensor of the magnetic field measuring device has at least one Hall element.

14. The magnetic field detector circuit according to claim 9, wherein the magnetic field measuring device activates the control input of the output transistor unit by the control signal.

15. A magnetic field detector circuit, the circuit comprising:
- a magnetic field measuring device with an input for a supply voltage and an output for a control signal, the output being connected to a control input of an output transistor unit, the magnetic field measuring device having a magnetic field sensor;
- a state control unit with an input for the supply voltage, an input for the control signal, and an output for a state signal formed depending on the control signal; and
- a state switch and a wake-up timer, the wake-up timer having an output for a wake-up signal and an input for the supply voltage, the state switch being arranged between the supply voltage input and the magnetic field measuring device and the wake-up timer,
wherein the state switch has an input for the state signal, and
wherein, based on the state signal, the magnetic field measuring device or the wake-up timer is supplied with the supply voltage by the state switch,
wherein the magnetic field detector circuit operates the magnetic field measuring device in an active state or in a sleep state, the supply voltage being applied to the magnetic field measuring device only in the active state,
wherein the wake-up signal is generated by the wake-up timer after a predetermined sleep interval, the magnetic field measuring device changing from the sleep state to the active state based on the wake-up signal,
wherein the state control unit changes the magnetic field measuring device to the sleep state if an output signal of the magnetic field sensor is below a predetermined voltage threshold.

* * * * *